US008843662B2

(12) United States Patent
Radovcic

(10) Patent No.: US 8,843,662 B2
(45) Date of Patent: Sep. 23, 2014

(54) PEEK/POKE INTERFACE ON RADIO SYSTEM CORE ENGINE MODEM TO ALLOW DEBUG DURING SYSTEM INTEGRATION

(75) Inventor: Boris Radovcic, Rockaway, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/465,237

(22) Filed: May 7, 2012

(65) Prior Publication Data

US 2012/0290741 A1 Nov. 15, 2012

Related U.S. Application Data

(60) Provisional application No. 61/484,030, filed on May 9, 2011.

(51) Int. Cl.
*G06F 3/00* (2006.01)
*H03K 19/177* (2006.01)
(52) U.S. Cl.
CPC ................................ *H03K 19/17728* (2013.01)
USPC .............................................................. 710/5

(58) Field of Classification Search
USPC ............................................................. 710/5
See application file for complete search history.

(56) References Cited

U.S. PATENT DOCUMENTS

| | | | |
|---|---|---|---|
| 6,216,191 B1 * | 4/2001 | Britton et al. ................. 710/305 |
| 2002/0152060 A1 * | 10/2002 | Tseng ............................. 703/17 |
| 2005/0041520 A1 * | 2/2005 | Takahashi et al. ............ 365/233 |
| 2011/0078525 A1 * | 3/2011 | Xia et al. ...................... 714/731 |

* cited by examiner

*Primary Examiner* — Chun-Kuan Lee
(74) *Attorney, Agent, or Firm* — Daniel J. Long

(57) ABSTRACT

A system and method for allowing individual register access during system integration and test is disclosed. A Chip select is routed between an OMAP processor and a waveform FPGA and configured to allow individual register access during system integration and test. Logic is then added to the FPGA to support the single access to the FPGA's peripherals. This allows the user connected to the debug port to be able to send and receive individual commands to and from the waveform FPGA's peripherals. A Graphical User Interface (GUI) maybe developed to provide a graphical interface or scripts may be used to assemble multiple commands thereby increasing flexibility to configure the peripherals during integration and troubleshooting.

15 Claims, 6 Drawing Sheets

PEEK/POKE INTERFACE ON RADIO SYSTEM CORE ENGINE MODEM TO ALLOW DEBUG DURING SYSTEM INTEGRATION

CROSS-REFERENCE TO RELATED APPLICATIONS

This Application claims rights under 35 USC §119(e) from U.S. Application Ser. No. 61/484,030 filed May 9, 2011, the contents of which are incorporated herein by reference.

TECHNICAL FIELD

Embodiments are generally related to radio systems. Embodiments are also related to methods for debugging radio systems. Embodiments are additionally related to system and method that allows individual register access during system integration and test. Embodiments are additionally related to a peek/poke interface on a radio system core engine modem to allow debug during system integration.

BACKGROUND OF THE INVENTION

A System on a Chip or System on Chip (SoC or SOC) is an integrated circuit (IC) that integrates all components of a computer or other electronic system into a single chip. It may contain digital, analog, mixed-signal, and often radio-frequency functions on a single chip substrate. Open Multimedia Application Platform (OMAP) is an application processor that integrate components of a computer system on a single chip. OMAP processors consist of a processor core and a group of Internet protocol (IP) modules. OMAP supports multimedia by providing hardware acceleration and interfacing with peripheral devices. Such OMAP processors are utilized as Core Engine Modem processor in radio systems.

Programmable logic devices (PLDs) exist as a well-known type of Integrated Circuit (IC) that can be programmed by a user to perform specified logic functions. The PLDs can be of programmable logic arrays (PLAs) or Complex Programmable Logic Devices (CPLDs). One type of PLD, called a Field Gate Array (FPGA), is popular because of a superior combination of capacity, flexibility, time-to-market, and cost.

In radio systems, interface between the Core Engine Modem processor and the Field Programmable Gate Array (FPGA) is implemented with a General Purpose Memory Controller bus configured for burst mode. In normal operations, General Purpose Memory Controller bus is efficiently utilized for quickly sending large amounts of data between the devices.

FIG. 1 illustrates a block diagram of a processor 102 configured with a FPGA 104 having an interface using a chip select CS4 for burst mode in radio system. The Core Engine Modem's OMAP processor 104 communicates with the waveform FPGA 106 via a General Purpose Memory Interface bus GPMC configured for burst mode using chip select CS4. The bus GPMC supports high speed transfer of large amounts of data to the peripherals 112 of FPGA 104 such as the RF FPGA 106, DAC 108, and ADC 110. The bus GPMC is desired for normal operation where large blocks of data needs to be transferred quickly between devices.

The burst operation of the bus GPMC is not useful during integration because block transfers cannot be easily initiated through the debug port on the OMAP. A need, therefore, exists for a method that allows individual register access during system integration and test through a separate chip select by adding special logic in the FPGA.

BRIEF SUMMARY

The following summary is provided to facilitate, an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for radio systems.

It is another aspect of the disclosed embodiments to provide for methods for debugging radio systems.

It is a further aspect of the present invention to provide for a system and method that allows individual register access during system integration and test in radio systems.

It is another aspect of the present invention to provide for a peek/poke interface on a radio system core engine modem to allow debug during system integration.

It is a yet another aspect of the present invention to provide for a system and method for addition of the special logic in the waveform FPGA that allows a user connected to the OMAP through a debugger port to send and receive individual commands to the waveform FPGA and its peripherals in radio systems.

The aforementioned aspects and other objectives and advantages can now be achieved as described herein. According to the present invention a chip select is assigned to between the Open Multimedia Applications Platform (OMAP) and FPGA which is configured for single read/write access. Logic was then added to the FPGA to support this single access to the FPGA's peripherals. This allows the user connected to the debug port to be able to send and receive individual commands to and from the waveform FPGA's peripherals. A Graphical User Interface (GUI) maybe developed to provide a graphical interface or scripts may be used to assemble multiple commands thereby increasing flexibility to configure the peripherals during integration and troubleshooting.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
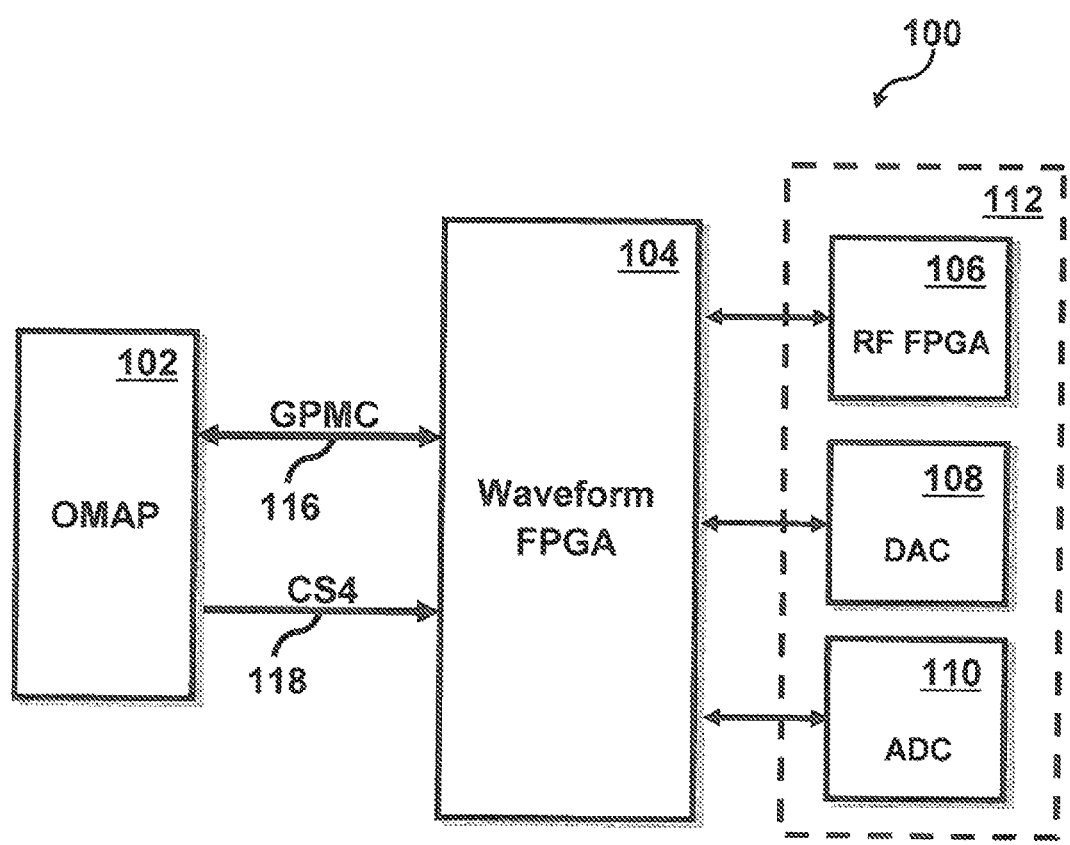
FIG. 1 illustrates a block diagram of an apparatus comprising a processor configured with a FPGA utilizing a chip select for burst mode in a prior art radio system.
Figure 2:
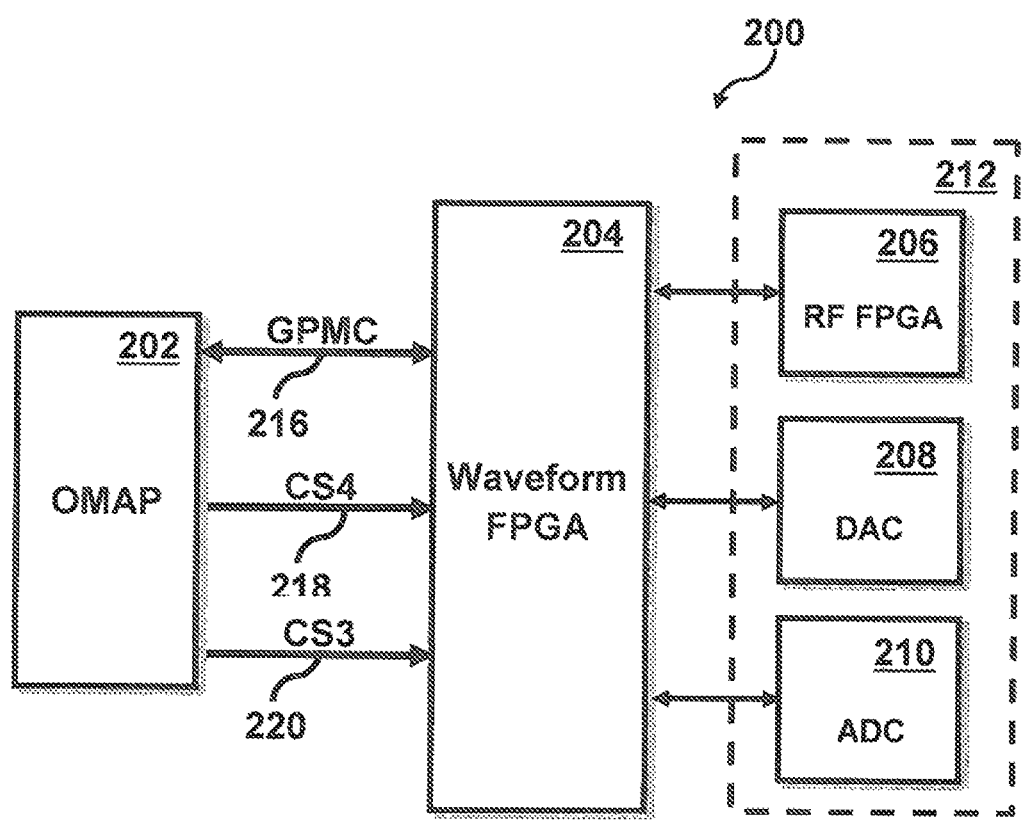
FIG. 2 illustrates a block diagram of an apparatus comprising a processor configured with a FPGA utilizing an additional chip select for individual register access during system integration and test in a radio system, in accordance with the disclosed embodiments.

FIG. 2 illustrates a block diagram of an apparatus 200 comprising a processor 202 configured with a waveform FPGA 104 in a radio system. A General Purpose Memory Interface (GPMC) 216 utilizes a chip select (CS4) 218 for quickly transferring large blocks of data between devices during system integration and testing. The processor 102 for example an Open Multimedia Applications Platform (OMAP) 102 communicates with the waveform FPGA 104 via the GPMC 216 configured for burst mode using chip select CS4. The interface GPMC supports high speed transfer of large amounts of data to the peripherals 212 such as the Radio Frequency Field Programmable Gate Array (RF FPGA 206), Digital-to-Analog Converter (DAC) 208, and Analog-to-Digital Converter (ADC) 210 of the waveform FPGA 204. For normal operation where large blocks of data need to be transferred quickly between devices, the interface GPMC 216 and chip select CS4 are utilized. In order to send and receive individual commands to and from the peripherals 212 of waveform FPGA 204 a chip select (CS3) 220 can be utilized. The chip select (CS3) 220 is assigned to between the OMAP 102 and FPGA 104 and configured for single access of the GPMC 216.

Figure 3:
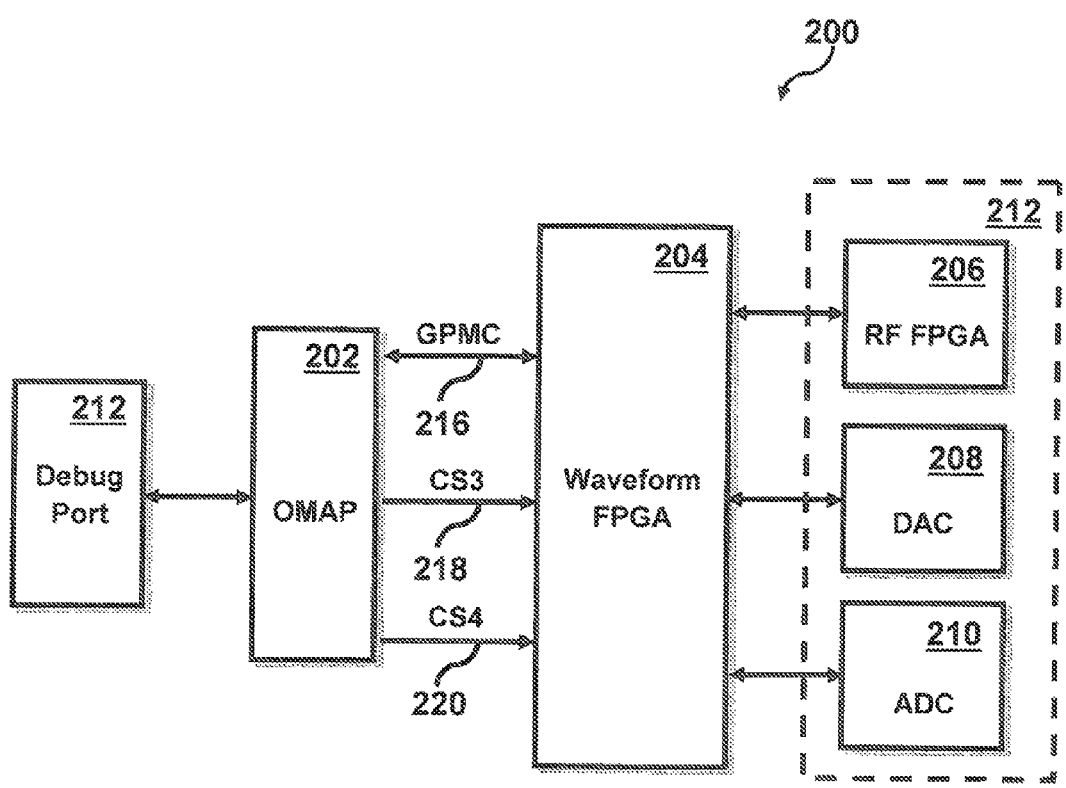
FIG. 3 illustrates a block diagram of the apparatus depicted in FIG. 2 comprising a debug port, in accordance with the disclosed embodiments.
Figure 4:
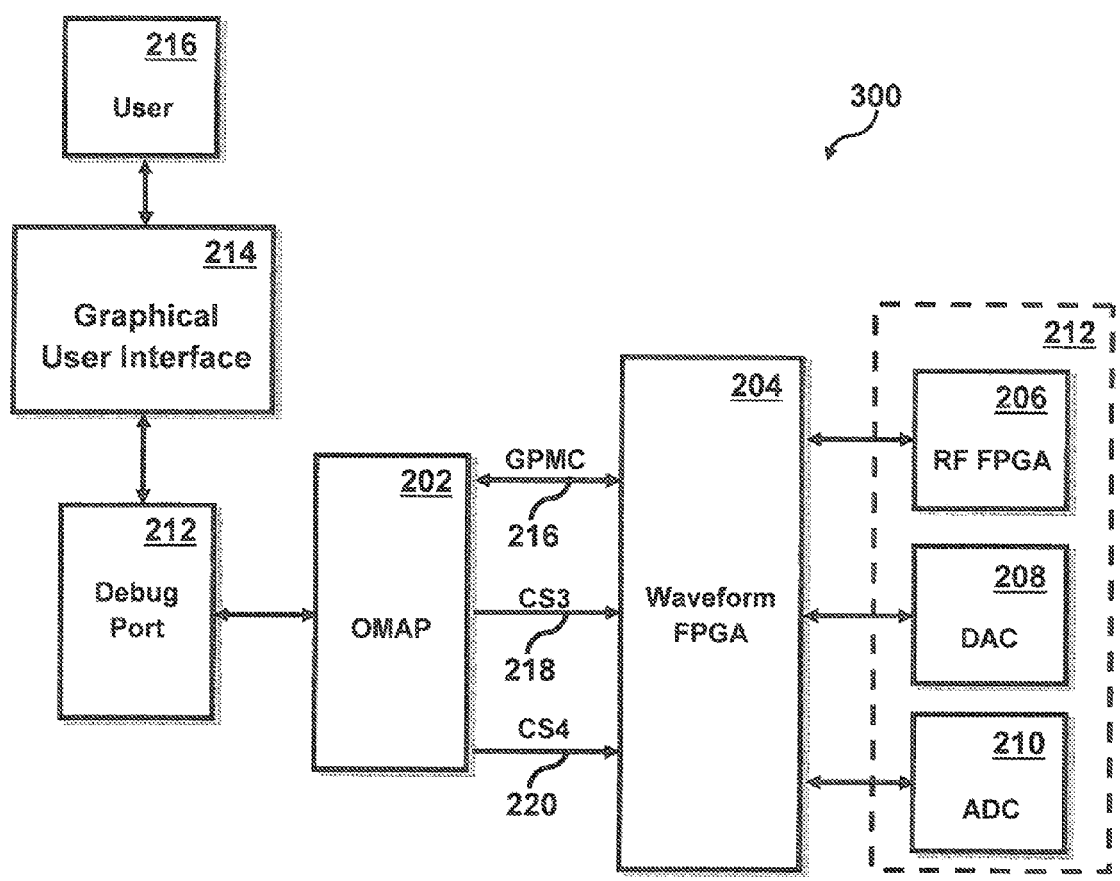
FIG. 4 illustrates a block diagram of the apparatus depicted in FIG. 3 comprising a GUI, in accordance with the disclosed embodiments.

Referring to FIG. 3, a block diagram of a processor configured with a FPGA depicted in FIG. 2 comprising FPGA peripherals and debug port is depicted. The burst operation of the interface GPMC is not useful during integration because block transfers cannot be easily initiated through the debug port 212 on the OMAP 202. To solve this, an extra chip select CS3 was routed between the OMAP 202 and the waveform FPGA 204 and the chip select CS3 was configured to single read/write access. Logic was then added to the FPGA 204 to support this single access to the peripherals 212 FPGA 204. FIG. 4 illustrates a block diagram of a processor configured with a FPGA depicted in FIG. 3 comprising GUI, in accordance with the disclosed embodiments. The user 216 connected to the debug port 212 to be able to send and receive individual commands to and from the peripherals 212 of the waveform FPGA 204. A Graphical User Interface (GUI) 214 maybe developed to provide a graphical interface or scripts may be used to assemble multiple commands thereby increasing flexibility to configure the peripherals 212 during integration and troubleshooting.

Figure 5:
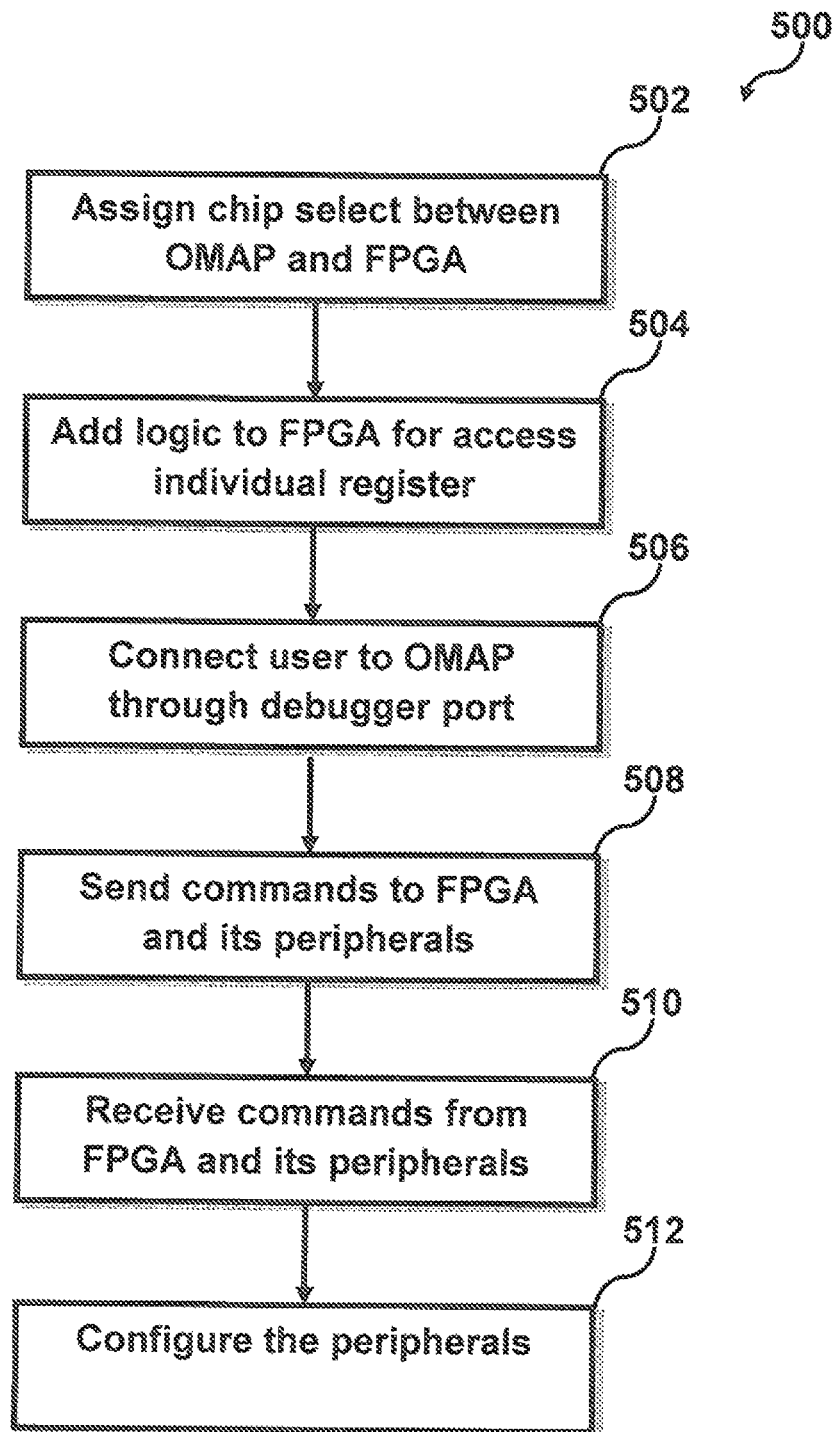
FIG. 5 illustrates a flow chart showing a method of configuring FPGA peripherals during integration and troubleshooting, using an extra chip select routed between the OMAP and the waveform FPGA through debugging port, in accordance with the disclosed embodiments.

FIG. 5 illustrates a flow chart 500 showing a method of configuring FPGA peripherals during integration and troubleshooting, using an extra $chi_p$ select routed between the OMAP and the waveform FPGA through debugging port, in accordance with the disclosed embodiments. Initially as said at block 502, a chip select is assigned and configured between OMAP and FPGA to allow individual register access to the waveform FPGA and its peripherals during system integration and test. Then, a logic to FPGA for access individual register as depicted at block 504. The user is connected to the debugger port for configuring the peripherals during integration and troubleshooting. As illustrated at block 506 and 508, the user can send and receive individual commands to and from the waveform FPGA's peripherals. Finally, as said at block 512 the peripherals are configured using the commands to and from the waveform FPGA's peripherals.

Figure 6:
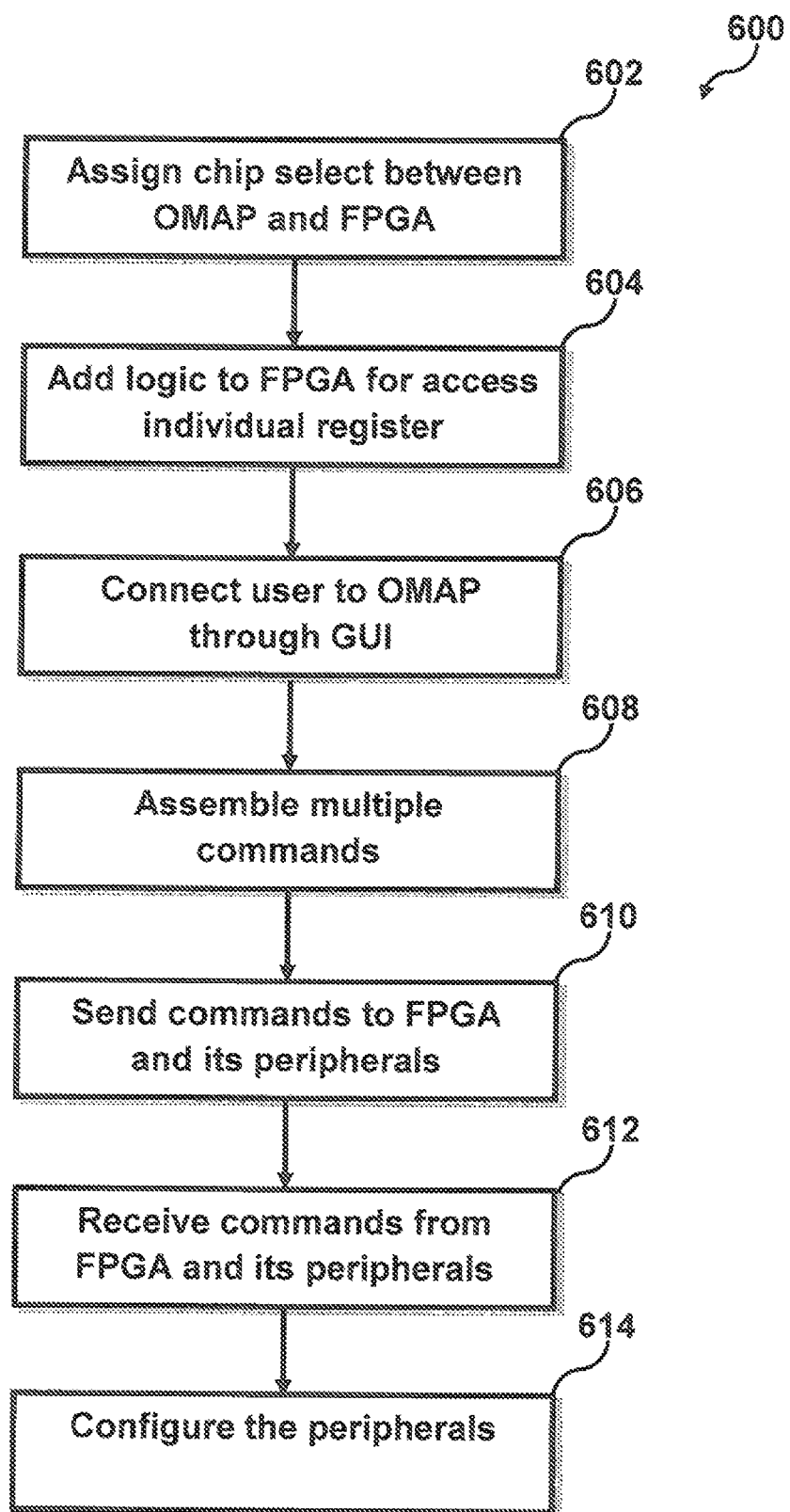
FIG. 6 illustrates a flow chart showing a method of configuring FPGA peripherals during integration and troubleshooting, using an extra chip select routed between the OMAP and the waveform FPGA through GUI, in accordance with the disclosed embodiments.

FIG. 6 illustrates a flow chart 600 showing a method of configuring FPGA peripherals during integration and troubleshooting, using an extra chip select routed between the OMAP and the waveform FPGA through GUI, in accordance with the disclosed embodiments. Initially as said at block 602, a chip select is assigned and configured between OMAP and FPGA to allow individual register access to the waveform FPGA and its peripherals during system integration and test. Then, logic is added to FPGA for accessing individual register as depicted at block 604. The user is connected to the debugger port through GUI for configuring the peripherals during integration and troubleshooting as depicted at block 606. As illustrated at block 608, the user assembles multiple commands in GUI for configuring the peripherals during integration and troubleshooting. As illustrated at block 506 and 508, the user can send and receive individual commands to and from the waveform FPGA's peripherals. Then, finally, as said at block 512 the peripherals are configured using the commands to and from the waveform FPGA's peripherals.

Those skilled in the art will understand that to peek and poke registers of a waveform FPGA and its peripherals to allow fine control of hardware during integration and test. Those skilled in the art will also appreciate that the method and apparatus of this invention allows individual register access during system integration and test.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for debugging radio systems comprising:
   assigning a chip select between a processor and a field programmable gate Array, wherein the chip select is configured for a single read/write access to one or more individual registers of the field programmable gate Array or one or more individual registers of a plurality of peripherals connected to the field programmable gate array;
   adding logic to the field programmable gate array for the single read/write access to the one or more individual registers of the field programmable gate Array or the one or more individual registers of the plurality of peripherals connected to the field programmable gate array;
   connecting at least one user to the processer through a debugger port;
   sending and receiving one or more individual commands to and from the one or more individual registers of the field programmable gate Array or the one or more individual registers of the plurality of peripherals by the user; and
   configuring the plurality of peripherals during the radio system integration and testing.

2. The method of claim 1 wherein the processer is an open multimedia applications platform processer.

3. The method of claim 1 further comprising developing a graphical user interface to provide a graphical interface for the user to access the plurality of peripherals during the radio system integration and testing.

4. The method of claim 3 wherein the graphical user interface is developed to provide the one or more commands.

5. The method of claim 4 wherein the one or more commands are utilized to access the plurality of peripherals during the radio system integration and testing.

6. The method of claim 1 wherein the plurality of peripherals comprises radio frequency field programmable gate array, a digital to analog converter and an analog to digital converter.

7. A system for debugging radio systems comprising:
- a processing unit comprising an open multimedia applications platform processer, a field programmable gate array interfaced with the processing unit; a plurality of peripherals connected to the field programmable gate array; and
- a chip in an interface between the processing unit and the field programmable gate array, wherein the chip is configured for a single read/write access to one or more individual registers of the field programmable gate Array or one or more individual registers of the plurality of peripherals, whereby addition of a logic in the field programmable gate array allow a user connected to the processing unit to send and receive one or more individual commands to and from the individual registers of the field programmable gate Array or the individual registers of the plurality of peripherals through a debugger port during the radio system integration and testing.

8. The system of claim 7 further comprising a graphical user interface is developed to provide a graphical interface for the user to access the plurality of peripherals during the radio system integration and testing.

9. The system of claim 8 wherein the graphical user interface is developed to provide the one or more commands.

10. The system of claim 9 wherein the one or more commands are utilized to access the plurality of peripherals during the radio system integration and testing.

11. The system of claim 7 wherein the plurality of peripherals comprises a radio frequency field programmable gate array, a digital to analog converter and an analog to digital converter.

12. A system for debugging radio systems comprising:
- a processing unit comprising an open multimedia applications platform processer;
- a field programmable gate array interfaced with the processing unit;
- a plurality of peripherals connected to the field programmable gate array;
- a chip in an interface between the processing unit and the field programmable gate array, wherein the chip is configured for a single read/write access to one or more individual registers of the field programmable gate Array or one or more individual registers of the plurality of peripherals, whereby addition of a logic in the field programmable gate array allow a user connected to the processing unit to send and receive one or more individual commands to and from the one or more individual registers of the field programmable gate array and the one or more individual registers of the plurality of peripherals through the debugger port, and
- a graphical user interface is developed to provide a graphical interface for the user to access the plurality of peripherals during the radio system integration and test.

13. The system of claim 12 wherein the graphical user interface is developed to provide the one or more commands.

14. The system of claim 12 wherein the one or more commands are utilized to access the plurality of peripherals during the radio system integration and testing.

15. The system of claim 12 wherein the plurality of peripherals comprises a radio frequency field programmable gate array, a digital to analog converter and an analog to digital converter.

\* \* \* \* \*